(12) United States Patent
Otsu et al.

(10) Patent No.: US 9,966,947 B2
(45) Date of Patent: May 8, 2018

(54) GATE DRIVING CIRCUIT FOR INSULATED GATE-TYPE POWER SEMICONDUCTOR ELEMENT

(71) Applicant: Mitsubishi Electric Corporation, Chiyoda-ku (JP)

(72) Inventors: Kazuhiro Otsu, Tokyo (JP); Junichiro Ishikawa, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days. days.

(21) Appl. No.: 15/320,658

(22) PCT Filed: Jul. 3, 2014

(86) PCT No.: PCT/JP2014/067771
§ 371 (c)(1),
(2) Date: Dec. 20, 2016

(87) PCT Pub. No.: WO2016/002041
PCT Pub. Date: Jan. 7, 2016

(65) Prior Publication Data
US 2017/0179950 A1 Jun. 22, 2017

(51) Int. Cl.
*H02M 7/48* (2007.01)
*H03K 17/687* (2006.01)
(Continued)

(52) U.S. Cl.
CPC ..... *H03K 17/6877* (2013.01); *H01L 29/0653* (2013.01); *H01L 29/0847* (2013.01);
(Continued)

(58) Field of Classification Search
CPC ...... H03K 17/10; H03K 17/102; H03K 17/12; H03K 17/122; H03K 17/16; H03K 17/161;
(Continued)

(56) References Cited

U.S. PATENT DOCUMENTS 6,127,745 A * 10/2000 Bolz .................... H02H 11/003
307/125
2010/0237911 A1* 9/2010 Svensson ............. H03K 17/163
327/109
(Continued)

FOREIGN PATENT DOCUMENTS

JP 5-226994 A 9/1993

OTHER PUBLICATIONS

International Search Report dated Aug. 26, 2014 in PCT/JP14/067771 Filed Jul. 3, 2014.
(Continued)

*Primary Examiner* — Timothy J Dole
*Assistant Examiner* — Bryan R Perez
(74) *Attorney, Agent, or Firm* — Oblon, McClelland, Maier & Neustadt, L.L.P.

(57) ABSTRACT

A gate driving circuit for an insulated gate-type power semiconductor element includes an Nch MOSFET which turns on the insulated gate-type power semiconductor element, a Pch MOSFET which turns off the insulated gate-type power semiconductor element, a control circuit which turns on the Nch MOSFET by applying a positive voltage to the gate electrode of the Nch MOSFET, and which turns on the Pch MOSFET by applying a negative voltage to the gate electrode of the Pch MOSFET, and a power supply which applies a negative voltage to the drain electrode of the Pch MOSFET and to a negative-side electrode of the control circuit, which applies a positive voltage to the drain electrode of the Nch MOSFET, and which applies to a positive-side electrode of the control circuit a positive voltage whose absolute value is larger than absolute value of the positive voltage applied to the drain electrode of the Nch MOSFET.

7 Claims, 4 Drawing Sheets

(51) Int. Cl.
*H02M 1/08* (2006.01)
*H02M 1/084* (2006.01)
*H03K 17/06* (2006.01)
*H01L 29/08* (2006.01)
*H01L 29/06* (2006.01)
*H02M 7/162* (2006.01)

(52) U.S. Cl.
CPC ......... *H02M 1/082* (2013.01); *H02M 1/0845* (2013.01); *H02M 7/1626* (2013.01); *H02M 7/48* (2013.01); *H03K 17/063* (2013.01)

(58) Field of Classification Search
CPC .... H03K 17/30; H03K 17/302; H03K 19/003; H03K 19/00307; H03K 19/00315; H03K 19/00346; H03K 19/00353; H03K 19/00361; H04L 25/026
USPC .................................................. 327/108–110
See application file for complete search history.

(56) References Cited

U.S. PATENT DOCUMENTS

2013/0222042 A1*  8/2013  Kikuchi ........... H03K 17/04123
                                                          327/374
2014/0084962 A1*  3/2014  Schuler ............ H03K 19/01852
                                                          327/108

OTHER PUBLICATIONS

International Preliminary Report on Patentability and Written Opinion dated Jan. 12, 2017 in PCT/JP2014/067771 (submitting English translation only).

\* cited by examiner

GATE DRIVING CIRCUIT FOR INSULATED GATE-TYPE POWER SEMICONDUCTOR ELEMENT

FIELD

This invention relates to a gate driving circuit for an insulated gate-type poser semiconductor element.

BACKGROUND

For example, Patent Literature discloses a gate driving circuit for an insulated gate-type power semiconductor element. The gate driving circuit is constituted of a transistor complementary output circuit.

CITATION LIST

Patent Literature

[PTL 1] JP 5-226994

In a case where the rated current of the insulated gate-type power semiconductor element is large, there is a need to increase the output current of the gate driving circuit. In this case, MOSFETs may be used in the complementary output circuit in the gate driving circuit.

In the case where the complementary output circuit has a Pch MOSFET positive side and Nch MOSFET negative side, a flow-through current flows through the Pch MOSFET and the Nch MOSFET when the Pch MOSFET and the Nch MOSFET are turned on simultaneously with each other.

On the other hand, in the case where the complementary output circuit has an Nch MOSFET positive side and a Pch MOSFET negative side, the Pch MOSFET and the Nch MOSFET are not turned on simultaneously with each other and no flow-through current flows.

SUMMARY

Technical Problem

However, when the same positive-side power supply is connected to the drain electrode and the gate electrode of the Nch MOSFET, a voltage dropped by a value corresponding to the gate threshold voltage of the Nch MOSFET form the positive voltage of the positive-side power supply is applied between the gate electrode and the source electrode of the insulated gate-type power semiconductor element. Thus, there is a possibility of worsening of a steady-state loss in the insulated gate-type power semiconductor element.

This invention his been achieved to solve the above-described problem. An object of this invention is to provide a gate driving circuit for an insulated gate-type power semiconductor element capable or preventing worsening of a steady-state loss in the insulated gate-type power semiconductor element.

Solution to Problem

A gate driving circuit for an insulated gate-type power semiconductor element according to this invention includes an Nch MOSFET having a source electrode, a drain electrode and a gate electrode, the source electrode being connected to a gate electrode of the insulated gate-type power semiconductor element, the Nch MOSFET being turned on to turn on the insulated gate-type power semiconductor element when a positive voltage is applied to the gate electrode of the Nch MOSFET while a positive voltage is being applied to the drain electrode of the Nch MOSFET, a Pch MOSFET having a source electrode, a drain electrode and a gate electrode, the source electrode being connected to the gate electrode of the insulated gate-type power semiconductor element, the Pch MOSFET being turned onto turn off the insulated gate-type power semiconductor element when a negative voltage is applied to the gate electrode of the Pch MOSFET while a negative voltage is being applied to the drain electrode of the Pch MOSFET, a control circuit having a control electrode, a positive-side electrode and a negative-side electrode, the control electrode being connected to the gate electrode of the Nch MOSFET and to the gate electrode of the Pch MOSFET, the control circuit turning on the Nch MOSFET by applying a positive voltage to the gate electrode of the Nch MOSFET while the positive voltage is being applied to the positive-side electrode, the control circuit turning on the Pch MOSFET by applying a net voltage to the gate electrode of the Pch MOSFET while the negative voltage is being applied to the negative-side electrode, and a power supply unit which applies a negative voltage to the drain electrode of the Pch MOSFET and to the negative-side electrode of the control circuit, which applies a positive voltage to the drain electrode of the Nch MOSFET, and which applies to the positive-side electrode of the control circuit a positive voltage whose absolute value is larger than the absolute value of the positive voltage applied to the drain electrode of the Nch MOSFET.

Advantageous Effects of Invention

According to this invention, the power supply unit applies to the positive-side electrode of the control circuit a positive voltage whose absolute value is larger than the absolute value of the positive voltage applied to the drain electrode of the Nch MOSFET. By the application of this positive voltage, the potential difference between the drain electrode and the source electrode of the Nch MOSFET is made sufficiently small. Prevention of worsening of a steady-state loss in the insulated gate-type power semiconductor element can thus be achieved.

DESCRIPTION OF EMBODIMENTS

A mode of implementation of this invention will be described with reference to the accompanying drawings. In the drawings, portions identical or corresponding to each other are assigned the same reference characters. Repeated description of the identical or corresponding portions is simplified or omitted as appropriate.

Embodiment 1

Figure 1:
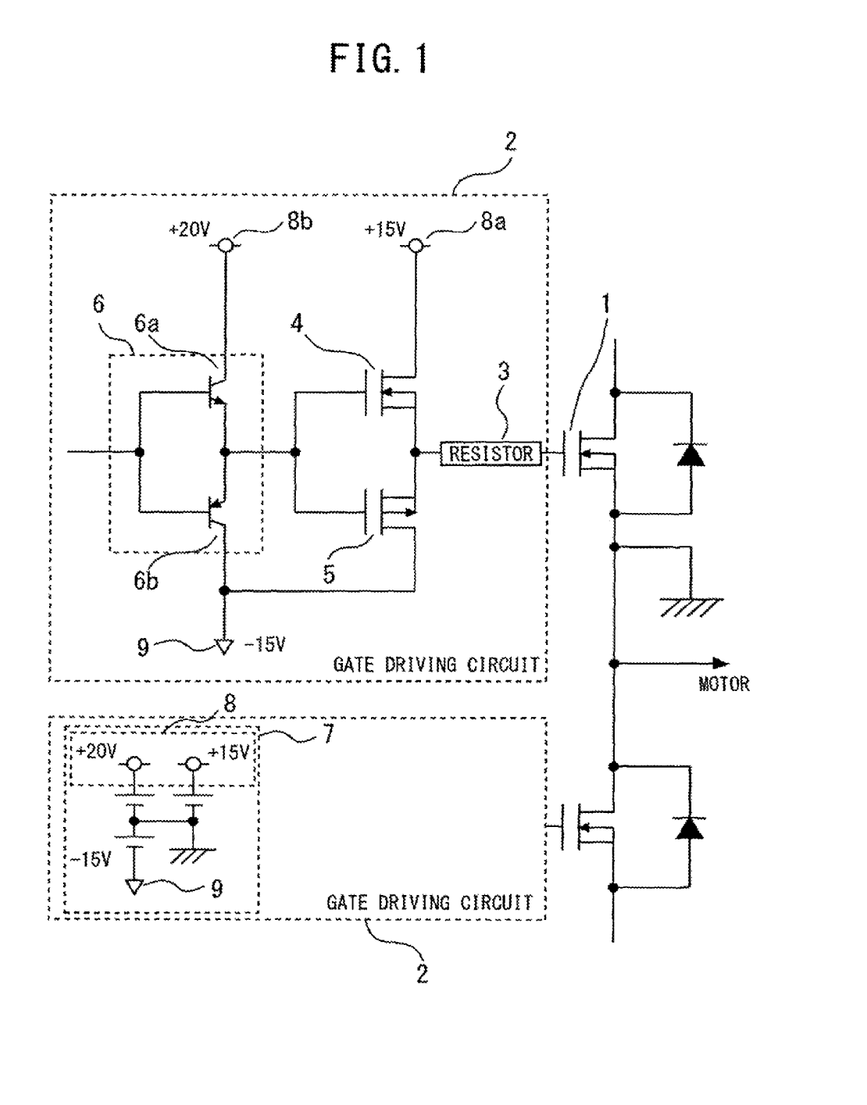
FIG. 1 is a diagram of a gate driving circuit for an insulated gate-type power semiconductor element in Embodiment 1 of this invention.

FIG. 1 is a diagram of a gate driving circuit for an insulated gate-type power semiconductor element in Embodiment 1 of this invention.

A power converter has a plurality of insulated gate-type power semiconductor elements 1. For example, each of the plurality of insulated gate-type power semiconductors is formed of an Nch MOSFET. The power converter converts direct current power into alternating current power through the operation of the plurality of insulated gate-type power semiconductor elements 1. The power converter supplies the alternating current power to a motor not shown in the figure.

Gate driving circuits 2 are provided in a one-to-one relationship with the insulated gate-type power semiconductor elements 1. Each gate driving circuit 2 has a resistor 3, an Nch MOSFET 4, a Pch MOSFET 5, a control circuit 6 and a power supply unit 7.

The resistor 3 is connected to a gate electrode of the insulated gate-type power semiconductor element 1. The Nch MOSFET 4 has a source electrode, a drain electrode and a gate electrode. The source electrode of the Nch MOSFET 4 is connected to the gate electrode of the insulated gate-type power semiconductor element 1 through the resistor 3. The Pch MOSFET 5 has a source electrode, a drain electrode and a gate electrode. The source electrode of the Pch MOSFET 5 is connected to the gate electrode of the insulated gate-type power semiconductor element 1 through the resistor 3.

The control circuit 6 has a positive-side switching element 6a and a negative-side switching element 6b.

The positive-side switching element 6a has an emitter electrode, a collector electrode and a base electrode. The emitter electrode of the positive-side switching element 6a is connected to the gate electrode of the Nch MOSFET 4 and to the gate electrode of the Pch MOSFET 5. The emitter electrode of the positive-side switching element 6a is a control electrode of the control circuit 6. The collect or electrode of the positive-side switching element 6a is a positive-side electrode oldie control circuit 6. The emitter electrode of the negative-side switching element 6b is connected to the gate electrode of the Nch MOSFET 4 and to the gate electrode of the Pch MOSFET 5. The emitter electrode of the negative-side switching element 6b is a control electrode of the control circuit 6. The collector electrode of the negative-side switching element 6b is a negative-side electrode of the control circuit 6.

The power supply unit 7 includes a positive-side power supply unit 8 and a negative-side power supply unit 9. The positive-side power supply unit 8 has a first positive-side power supply 8a and a second positive-side power supply 8b.

A positive-side electrode of the first positive-side power supply 8a is connected to the drain electrode of the Nch MOSFET 4. A negative-side electrode of the first positive-side power supply 8a is connected to a source electrode of the insulated gate-type power semiconductor element 1. A positive-side electrode of the second positive-side power supply 8b is connected to the collector electrode of the positive-side switching element 6a. A negative-side electrode of the second positive-side power supply 8b is connected to the source electrode of the insulated vase-type power semiconductor element 1. A positive-side electrode of the negative-side power supply unit 9 is connected to the source electrode of the insulated gate-type power semiconductor element 1. A negative-side electrode of the negative-side power supply unit 9 is connected to the drain electrode of the Pch MOSFET 5 and to the collector electrode of the negative-side switching element 6b.

For example, the negative-side power supply unit 9 applies a negative voltage of −15 V to the drain electrode of the Pch MOSFET 5 and to the collector electrode of the negative-side switching element 6b. For example, the first positive-side power supply 8a applies a positive voltage of +15 V to the drain electrode of the Nch MOSFET 4. The second positive-side poser supply 8b applies to the collector electrode of the positive-side switching element 6a a positive voltage whose absolute value is larger than the absolute value of the positive voltage applied by the first positive-side power supply 8a. The difference between the absolute value of the positive voltage applied by the second positive-side power supply 8b and the absolute value of the positive voltage applied by the first positive-side power supply 8a is set w a value larger than the value of the gate threshold voltage of the Nch MOSFET 4. For example, the second positive-side power supply 8b applies a positive voltage of +20 V to the collector electrode of the positive-side switching element 6a.

When the negative-side switching element 6b is turned on by external control, the neat voltage −15 V is applied to the gate electrode of the Pch MOSFET 5. By the application of this negative voltage, the Pch MOSFET 5 is turned on. A negative voltage is thereby applied to the gate electrode of the insulated gate-type power semiconductor element 1. As a result, the insulated gate-type power semiconductor element 1 is turned off.

When the positive-side switching element 6a is tamed on by external control, the positive voltage +20 V is applied to the gate electrode of the Nch MOSFET 4. By the application of this positive voltage, the Nch MOSFET 4 is turned on. At this time, a positive voltage is applied between the gate electrode and the source electrode of the Nch MOSFET 4. This positive voltage is +5 V, the result of subtraction +15 V applied to the drain electrode from +20 V applied to the gate electrode of the Nch MOSFET 4.

At this time, the potential difference between the drain electrode and the source electrode of the Nch MOSFET 4 is sufficiently small. As a result, the positive voltage +15 V is applied between the gate electrode and the source electrode of the insulated gate-type power semiconductor element 1. Variation of the gate threshold voltage of the Nch MOSFET 4 does not influence this operation.

Characteristics in the case where the insulated gate-type power semiconductor element 1 is an Nch MOSFET will be described with reference to FIG. 2.

Figure 2:
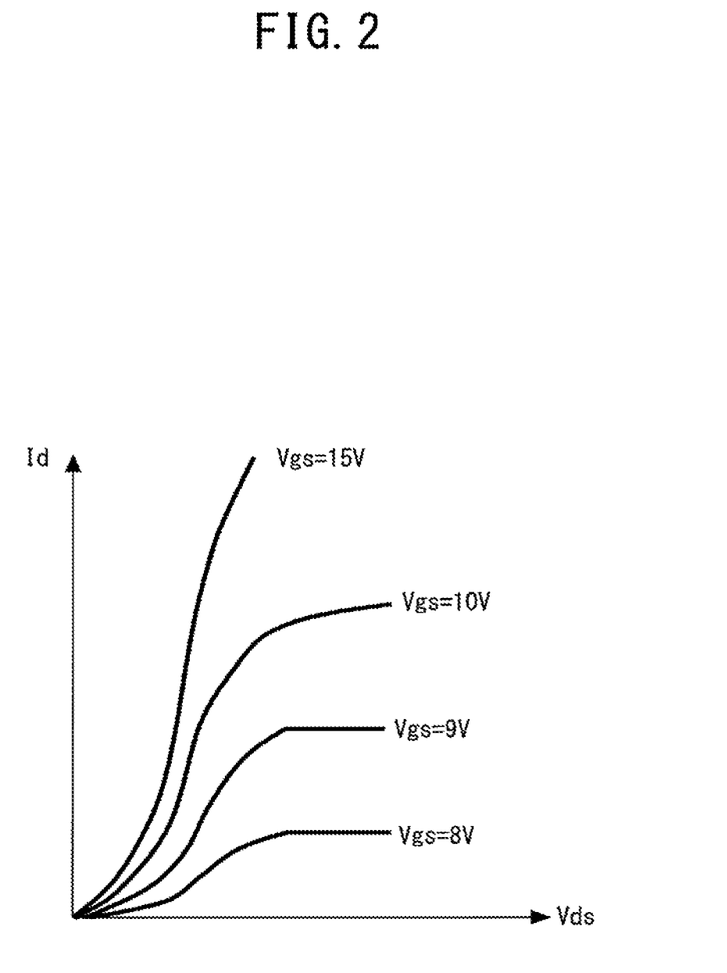
FIG. 2 is a graph showing characteristics of the insulated gate-type power semiconductor element in Embodiment 1 of this invention.

FIG. 2 is a diagram showing characteristics of the insulated gate-type you semiconductor element 1 in Embodiment 1 of this invention.

In FIG. 2, Vgs represents the voltage between the gate electrode and the source electrode of the insulated gate-type power semiconductor element 1; Vds, the voltage between the drain electrode and the source electrode of the insulated gate-type power semiconductor element 1; and Id, the drain current of the insulated gate-type power semiconductor element 1.

When the drain current Id is constant, the voltage Vds between the drain electrode and the source electrode becomes lower with increase in voltage Vgs between the gate electrode and the source electrode. A steady-state loss in the insulated gate-type power semiconductor element 1 becomes smaller with reduction in voltage Vds between the drain electrode and the source electrode.

In Embodiment 1 described above, the power supply unit 7 applies to the positive-side electrode of the control circuit 6 a positive voltage whose absolute value is larger than the absolute value of the positive voltage applied to the drain electrode of the Nch MOSFET 4. By the application of this positive voltage, the potential difference between the drain electrode and the source electrode of the Nch MOSFET 4 is made sufficiently small. Therefore, a large voltage can be applied with stability to the gate electrode of the insulated gate-type power semiconductor element 1 even if the gate threshold voltage of the Nch MOSFET 4 varies depending on element-to-element variation of the Nch MOSFET or on the environment. Prevention of worsening of a steady-state loss in the insulated gate-type power semiconductor element 1 can thus be achieved. In this case, the efficiency of the power converter is improved. A reduction in size and a reduction in cost of the power converter can thus be achieved. Further, with the improvement in efficiency of the power converter, the value by which the temperature of the power converter rises is reduced. An improvement in lifetime of the power converter can thus be achieved.

More specifically, the positive-side power supply unit 8 has the first positive-side power supply 8a and the second positive-side power supply 8b. The first positive-side power supply 8a applies a positive voltage to the draw electrode of the Nch MOSFET 4. The second positive-side power supply 8b applies to the positive-side electrode of the control circuit 6 a positive voltage whose absolute value is larger than the absolute value of the positive voltage applied to the drain electrode of the Nch MOSFET 4. Thus, simply using two different positive-side power supplies enables prevention of worsening of a steady state loss in the insulated gate-type power semiconductor element 1.

Embodiment 2

Figure 3:
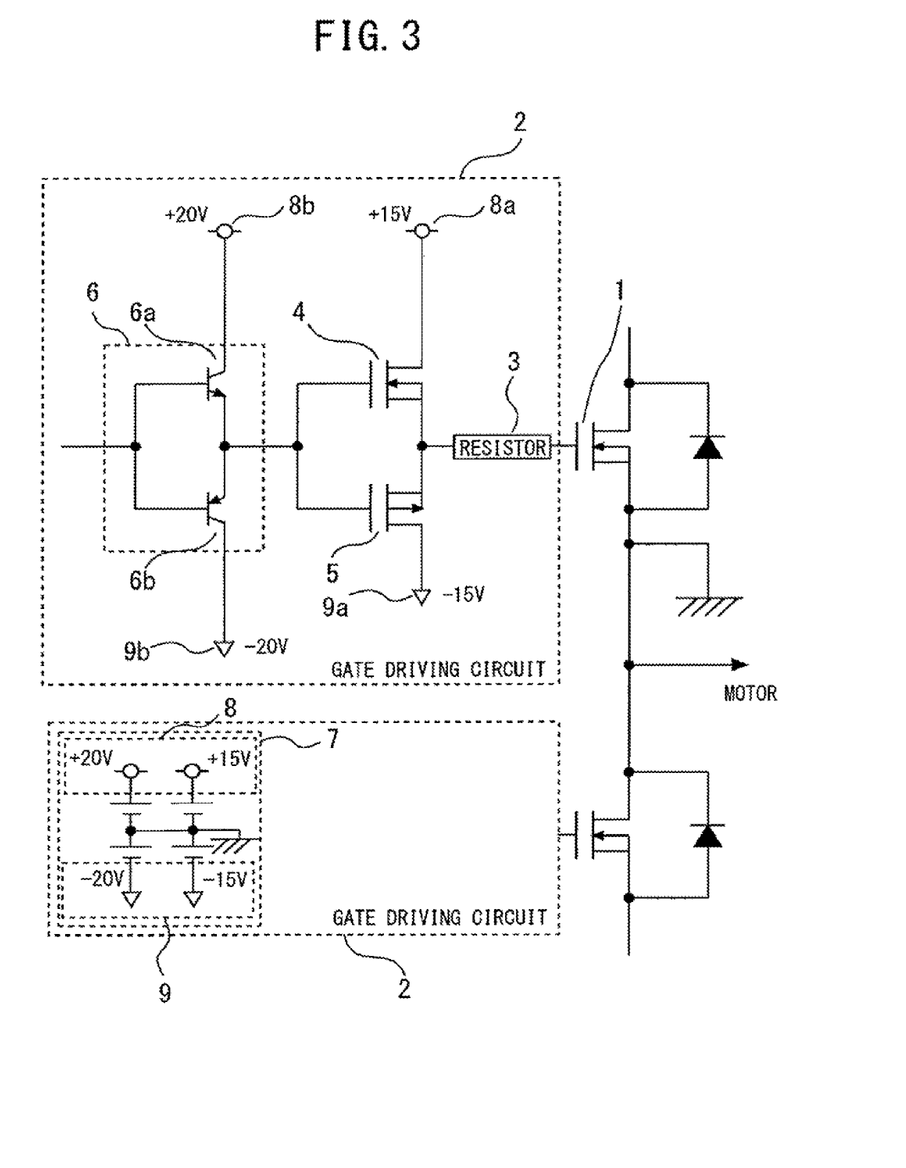
FIG. 3 is a diagram of a gate driving circuit for an insulated gate-type power semiconductor element in Embodiment 2 of this invention.

FIG. 3 is a diagram of a gate driving circuit for an insulated gate-type power semiconductor element in Embodiment 2 of this invention. Portions identical or corresponding to those in Embodiment 1 are assigned the same reference characters. The description of the identical or corresponding portions is omitted.

The power supply unit 7 in Embodiment 1 applies the same negative voltage to the drain electrode of the Pch MOSFET 5 and to the negative-side electrode of the control circuit 6. The power supply unit 7 in Embodiment 2 applies to the negative-side electrode of the control circuit 6 a negative voltage whose absolute value is larger than the absolute value of the negative voltage applied to the drain electrode of the Pch MOSFET 5.

More specifically, the negative-side power supply unit 9 has a first negative-side power supply 9a and a second net power supply 9b. The first negative-side power supply 9a applies a negative voltage to the drain electrode of the Pch MOSFET 5. The second negative-side power supply 9b applies to the negative-side electrode of the control circuit 6 a negative voltage whose absolute value is larger than the absolute value of the negative voltage applied to the drain electrode of the Pch MOSFET 5. The difference between the absolute value of the negative voltage applied to the negative-side electrode of the control circuit 6 and the absolute value of the negative voltage applied to the drain electrode of the Pch MOSFET 5 is set to a value larger than the value of the gate threshold voltage of the Pch MOSFET 5. For example, the second negative-side power supply 9b applies a negative voltage of −20 V to the collector electrode of the negative-side switching element 6b.

In Embodiment 2 described above, the power supply unit 7 applies to the negative-side electrode of the control circuit 6 a negative voltage to absolute value is larger than the absolute value of the negative voltage applied to the drain electrode of the Pch MOSFET 5. By the application of this positive voltage, the potential difference between the drain electrode and the source electrode of the Pch MOSFET 5 is made sufficiently small. The negative voltage applied to the gate electrode of the insulated gate-type power semiconductor element 1 can thus be stabilized.

More specifically, the negative-side power supply unit 9 has the first negative-side power supply 9a and the second negative-side power supply 9b. The first negative-side power supply 9a applies a negative voltage to the drain electrode of the Pch MOSFET 5. The second negative power supply applies to the negative-side electrode of the control circuit 6 a negative voltage whose absolute value is larger than the absolute value of the negative voltage applied to the drain electrode of the Pch MOSFET 5. Thus, simply using two different negative-side power supplies enables stabilization of the negative voltage applied to the gate electrode of the insulated gate-type power semiconductor element 1.

Embodiment 3

Figure 4:
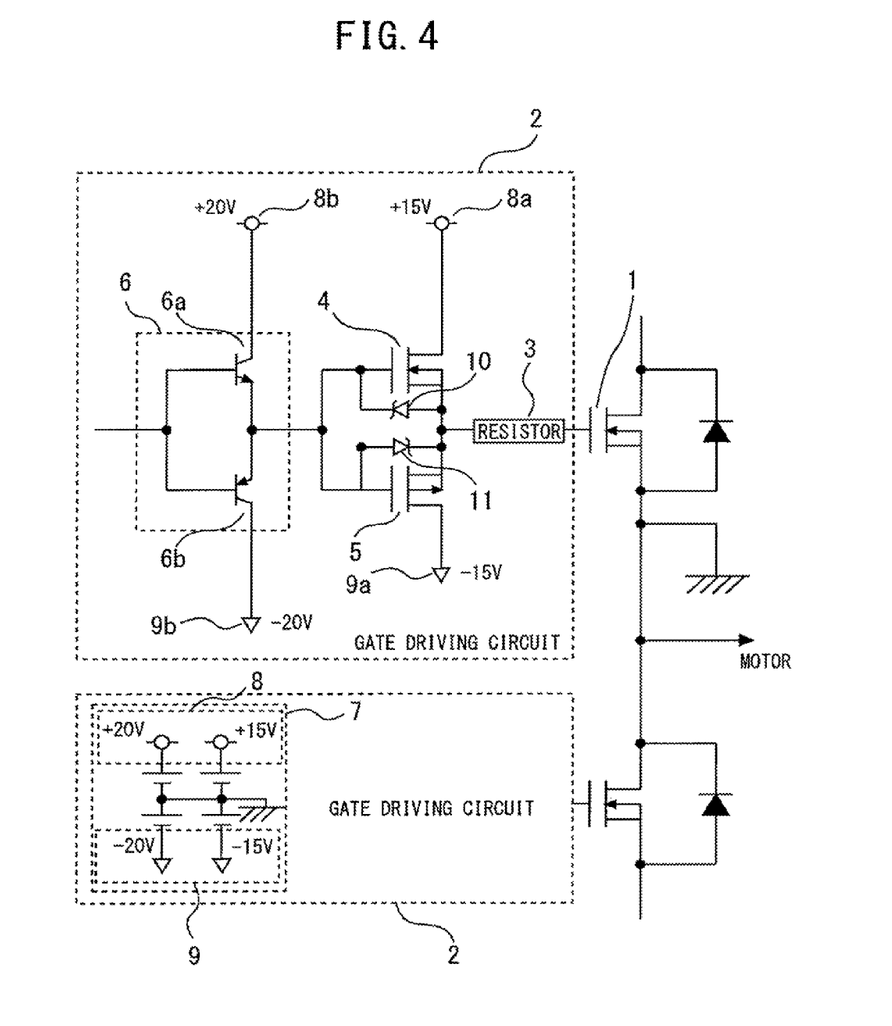
FIG. 4 is a diagram of a gate driving circuit for an insulated gate-type power semiconductor element in Embodiment 3 of this invention.

FIG. 4 is a diagram of a gate driving circuit for an insulated gate-type power semiconductor element in Embodiment 3 of this invention. Portions identical or corresponding to those in Embodiment 2 are assigned the same reference characters. The description of the identical or corresponding portions is omitted.

The gate driving circuit 2 in Embodiment 3 is formed by adding a positive-side Zener diode 10 and a negative-side Zener diode 11 to the gate driving circuit 2 in Embodiment 2. The positive-side Zener diode 10 is connected between the gate electrode and the source electrode of the Nch MOSFET 4. The negative-side Zener diode 11 is connected between the gate electrode and the source electrode of Pch MOSFET 5.

When the insulated gate-type power semiconductor element 1 is changed from the off state to the on state, the Nch MOSFET 4 is changed from the all state to the on state. At this time, there is a possibility of the time period during which the voltage between the gate electrode and the source electrode of the insulated gate-type power semiconductor element 1 changes from the negative voltage to the positive voltage being longer than the time period during which the voltage between the gate electrode and the source electrode of the Nch MOSFET 4 changes from the negative voltage to the positive voltage.

In this case, a high positive voltage can be applied between the gate electrode and the source electrode of the Nch MOSFET 4. The absolute value of this positive voltage is 30 (V), the sum of the positive voltage of the first positive-side power supply 8a and the negative voltage of the first negative-side power supply 9a. The absolute value of this positive voltage is larger than the absolute value of the maximum rated voltage between the gate electrode and the source electrode of the Nch MOSFET 4.

At this time, however, a large current flows abruptly through the positive-side Zener diode 10. As a result, the voltage between the gate electrode and the source electrode of the Nch MOSFET 4 is maintained at the Zener voltage of the positive-side Zener diode 10. There is a need to select the Zener voltage such that the value of the Zener voltage is smaller than the absolute value of the maximum rated voltage between the gate electrode and the source electrode of the Nch MOSFET 4.

When the insulated gate-type power semiconductor element 1 is changed front the on state to the off state, the Pch MOSFET 5 is changed from the off state to the on state. At this time, there is a possibility of the time period during which the voltage between the gate electrode and the source electrode of the insulated gate-type power semiconductor element 1 changes from the positive voltage to the negative voltage being longer than the time period during which the voltage between the gate electrode and the source electrode of the Pch MOSFET 5 changes from the negative voltage to the positive voltage.

In this case, a high negative voltage can be applied between the gate electrode and the source electrode of the Pch MOSFET 5. The absolute value of this negative voltage is 30 (V), the sum of the positive voltage of the first positive-side power supply 8a and the negative voltage of the first negative-side power supply 9a. The absolute value of this negative voltage is larger than the absolute value of the maximum rated voltage between the gate electrode and the source electrode of the Pch MOSFET 5.

At this time, however, a large current flows abruptly through the negative-side Zener diode 11. As a result, the voltage between the gate electrode and the source electrode of the Pch MOSFET 5 is maintained at the Zener voltage of the negative-side Zener diode 11. There is a need to select the Zener voltage such that the value of the Zener voltage is smaller than the absolute value of the maximum rated voltage between the gate electrode and the source electrode of the Pch MOSFET 5.

In Embodiment 3 described above, the positive-side Zener diode 10 is connected between the gate electrode and the source electrode of the Nch MOSFET 4. Breakdown of the Nch MOSFET 4 when the insulated gate-type power semiconductor element 1 is changed from the off state to the on state can thus be prevented.

Also, the negative-side Zener diode 11 is connected between the gate electrode and the source electrode of the Pch MOSFET 5. Breakdown of the Pch MOSFET 5 when the insulated gate-type power semiconductor element 1 is changed from the on state to the off state can thus be prevented.

Each of the gate driving circuits 2 in Embodiments 1 to 3 can also be applied to an insulated gate-type power semiconductor element in a power converter which makes conversion from alternating current power to direct current power.

In Embodiments 1 to 3, the output electrode of the control circuit 6 may be connected to at least one of the gate electrode of the Nch MOSFET 4 and the gate electrode of the Pch MOSFET 5 through a resistor.

In Embodiments 1 to 3, a first resistor and a second resistor may be used instead of the resistor 3. The first resistor may be provided between the drain electrode of the Nch MOSFET 4 and the first positive-side power supply 8a. The second resistor may be provided between the drain electrode of the Pch MOSFET 5 and the negative-side power supply unit 9 or 9a.

In Embodiments 1 to 3, the gate electrode of the insulated gate-type power semiconductor element 1 may be directly connected to at least one of the source electrode of the Nch MOSFET 4 and the source electrode of the Pch MOSFET 5 without interposing the resistor 3 therebetween.

In Embodiments 1 to 3, the insulated gate type power semiconductor element 1 may alternatively be a semiconductor element different from the Nch MOSFET. The insulated gate-type power semiconductor element 1 may be, for example, a semiconductor element formed of an IGBT or a semiconductor element formed of a wide-bandgap semiconductor, e.g., silicon carbide, a gallium nitride-based material or diamond.

In a case where the insulated gate-type power semiconductor element 1 is a semiconductor element formed of a wide-bandgap semiconductor, it can be expected that the insulated gate-type of power semiconductor element 1 itself is improved in efficiency. In such a case, the magnitude of steady-state loss based on the voltage applied to the gate electrode of the insulated gate-type power semiconductor element 1 largely influences a loss in the power converter. Therefore, the gate driving circuit 2 can have a higher effect in the case where the insulated gate-type power semiconductor element 1 is a semiconductor element formed of a wide-bandgap semiconductor.

INDUSTRIAL APPLICABILITY

As described above, the gate driving circuit for an insulated gate-type power semiconductor element according to this invention can be used in a system which prevents worsening of a steady-state loss in the insulated gate-type power semiconductor element.

REFERENCE SIGNS LIST

1 Insulated gate-type power semiconductor element
2 Gate driving circuit
3 Resistor
4 Nch MOSFET
5 Pch MOSFET
6 Control circuit
6a Positive-side switching element
6b Negative-side switching element
7 Power supply unit
8 Positive-side power supply unit
8a First positive-side power supply
8b Second positive-side power supply
9 Negative-side power supply unit
9a First negative-side power supply
9b Second negative-side power supply
10 Positive-side Zener diode
11 Negative-side Zener diode

The invention claimed is:

1. A gate driving circuit for an insulated gate-type power semiconductor element, comprising:

an Nch MOSFET having a source electrode, a drain electrode and a gate electrode, the source electrode being connected to a gate electrode of the insulated gate-type power semiconductor element, the Nch MOSFET being turned on to turn on the insulated gate-type power semiconductor element when a positive voltage is applied to the gate electrode of the Nch MOSFET while a positive voltage is being applied to the drain electrode of the Nch MOSFET;

a Pch MOSFET having a source electrode, a drain electrode and a gate electrode, the source electrode being connected to the gate electrode of the insulated gate-type power semiconductor element, the Pch MOSFET being turned on to turn off the insulated gate-type power semiconductor element when a negative voltage is applied to the gate electrode of the Pch MOSFET while a negative voltage is being applied to the drain electrode of the Pch MOSFET;

a control circuit having a control electrode, a positive-side electrode and a negative-side electrode, the control electrode being connected to the gate electrode of the Nch MOSFET and to the gate electrode of the Pch MOSFET, the control circuit turning on the Nch MOSFET by applying a positive voltage to the gate electrode of the Nch MOSFET while the positive voltage is being applied to the positive-side electrode, the control circuit turning on the Pch MOSFET by applying a negative voltage to the gate electrode of the Pch MOSFET while a negative voltage is being applied to the negative-side electrode; and a power supply unit which applies a negative voltage to the drain electrode of the Pch MOSFET and to the negative-side electrode of the control circuit, which applies a positive voltage to the drain electrode of the Nch MOSFET, and which applies to the positive-side electrode of the control circuit a positive voltage whose absolute value is larger than an absolute value of the positive voltage applied to the drain electrode of the Nch MOSFET.

2. The gate driving circuit for an insulated gate-type power semiconductor element according to claim 1, wherein the power supply unit has:

a first positive-side power supply having a positive-side electrode connected to the drain electrode of the Nch MOSFET, and a negative-side electrode connected to the source electrode of the insulated gate-type power semiconductor element, the first positive-side power supply applying a positive voltage to the drain electrode of the Nch MOSFET; and a second positive-side power supply having a positive-side electrode connected to the positive-side electrode of the control circuit, and a negative-side electrode connected to the source electrode of the insulated gate-type power semiconductor element, the second positive-side power supply applying to the positive-side electrode of the control circuit a positive voltage whose absolute value is larger than the absolute value of the positive voltage applied to the drain electrode of the Nch MOSFET.

3. The gate driving circuit for an insulated gate-type power semiconductor element according to claim 1, further comprising a positive-side Zener diode connected between the gate electrode and the source electrode of the Nch MOSFET.

4. The gate driving circuit for an insulated gate-type power semiconductor element according to claim 1, wherein the power supply unit applies to the negative-side electrode of the control circuit a negative voltage whose absolute value is larger than the absolute value of the negative voltage applied to the drain electrode of the Pch MOSFET.

5. The gate driving circuit for an insulated gate-type power semiconductor element according to claim 4, wherein the power supply unit has:

a first negative-side power supply having a positive-side electrode connected to the source electrode of the insulated gate-type power semiconductor element, and a negative-side electrode connected to the drain electrode of the Pch MOSFET, the first negative-side power supply applying a negative voltage to the drain electrode of the Pch MOSFET; and a second negative-side power supply having a positive-side electrode connected to the source electrode of the insulated gate-type power semiconductor element, and a negative side electrode connected to the negative-side electrode of the control circuit, the second negative-side power supply applying to the negative-side electrode of the control circuit a negative voltage whose absolute value is larger than the absolute value of the negative voltage applied to the drain electrode of the Pch MOSFET by the first negative-side power supply.

6. The gate driving circuit for an insulated gate-type power semiconductor element according to claim 1, further comprising a negative-side Zener diode connected between the gate electrode and the source electrode of the Pch MOSFET.

7. The gate driving circuit for an insulated gate-type power semiconductor element according to claim 1, wherein the insulated gate-type power semiconductor element is formed of a wide-bandgap semiconductor.

* * * * *